(12) United States Patent
Jang et al.

(10) Patent No.: US 11,594,356 B2
(45) Date of Patent: Feb. 28, 2023

(54) MAGNETIC FIELD SHIELDING SHEET, METHOD FOR MANUFACTURING MAGNETIC FIELD SHIELDING SHEET, AND ANTENNA MODULE USING SAME

(71) Applicant: AMOSENSE CO., LTD., Cheonan-si (KR)

(72) Inventors: Kil Jae Jang, Seongnam-si (KR); Dong Hoon Lee, Yongin-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 133 days.

(21) Appl. No.: 17/265,559

(22) PCT Filed: Aug. 14, 2019

(86) PCT No.: PCT/KR2019/010383
§ 371 (c)(1),
(2) Date: Feb. 3, 2021

(87) PCT Pub. No.: WO2020/060035
PCT Pub. Date: Mar. 26, 2020

(65) Prior Publication Data
US 2021/0241956 A1    Aug. 5, 2021

(30) Foreign Application Priority Data

Sep. 19, 2018  (KR) .................. 10-2018-0112324

(51) Int. Cl.
*H01F 10/26* (2006.01)
*H02J 50/20* (2016.01)
(Continued)

(52) U.S. Cl.
CPC ......... *H01F 10/265* (2013.01); *H01F 27/366* (2020.08); *H01F 38/14* (2013.01);
(Continued)

(58) Field of Classification Search
CPC ...... H01F 10/265; H01F 27/366; H01F 38/14; H01F 41/0266; H01F 41/32;
(Continued)

(56) References Cited

U.S. PATENT DOCUMENTS

2013/0022811 A1* 1/2013 Ahn .................... C23C 16/0272
977/734
2014/0048309 A1* 2/2014 Kihara .................. H01B 17/56
174/209

(Continued)

FOREIGN PATENT DOCUMENTS

EP          2139011         12/2009
KR        20170009301        1/2017
(Continued)

OTHER PUBLICATIONS

International Search Report—PCT/KR2019/010383 dated Nov. 27, 2019.

*Primary Examiner* — Jared Fureman
*Assistant Examiner* — Michael J Warmflash
(74) *Attorney, Agent, or Firm* — Cantor Colburn LLP (57) ABSTRACT

Provided are a roll-shaped magnetic field shielding sheet, a method of manufacturing a magnetic field shielding sheet, and an antenna module using the same, which can improve the efficiency of the overall production process by improving a heat treatment process for a thin film magnetic sheet. The magnetic field shielding sheet includes: at least one thin film magnetic sheet; an insulating layer or insulating layers formed on one or either side of the at least one thin film magnetic sheet; and an adhesive layer formed between the insulating layers of the adjacent thin film magnetic sheets to laminate and bond the thin film magnetic sheets, wherein the thin film magnetic sheet is flake-treated to be divided into a plurality of magnetic substance fragments.

15 Claims, 6 Drawing Sheets

(51) Int. Cl.
- *H02J 50/70* (2016.01)
- *H01F 38/14* (2006.01)
- *H01F 41/02* (2006.01)
- *H01F 41/32* (2006.01)
- *H01F 27/36* (2006.01)
- *H01F 10/00* (2006.01)
- *H01F 10/13* (2006.01)
- *H01F 10/14* (2006.01)
- *H05K 9/00* (2006.01)

(52) U.S. Cl.
CPC ......... *H01F 41/0266* (2013.01); *H01F 41/32* (2013.01); *H02J 50/20* (2016.02); *H02J 50/70* (2016.02); *H01F 10/007* (2013.01); *H01F 10/131* (2013.01); *H01F 10/138* (2013.01); *H01F 10/142* (2013.01); *H05K 9/0075* (2013.01)

(58) Field of Classification Search
CPC .... H01F 10/007; H01F 10/131; H01F 10/138; H01F 10/142; H01F 10/13; H01F 10/08; H01F 1/12; H01F 41/02; H02J 50/20; H02J 50/70; H02J 50/12; H02J 50/10; H05K 9/0075; B32B 3/18; B32B 2307/206; B32B 2307/208; H01Q 1/526

See application file for complete search history.

(56) References Cited

U.S. PATENT DOCUMENTS

| | | | |
|---|---|---|---|
| 2015/0123604 A1* | 5/2015 | Lee | H02J 50/70 428/307.3 |
| 2017/0040777 A1* | 2/2017 | von Zur Muehlen | H01R 31/02 |
| 2017/0051570 A1* | 2/2017 | Wold | E21B 43/10 |
| 2018/0286546 A1* | 10/2018 | Lee | B32B 9/005 |

FOREIGN PATENT DOCUMENTS

| | | | |
|---|---|---|---|
| KR | 20170040444 | 4/2017 | |
| KR | 20170051570 | 5/2017 | |
| WO | WO-2014137151 A1 * | 9/2014 | ....... G06K 19/07783 |

* cited by examiner

MAGNETIC FIELD SHIELDING SHEET, METHOD FOR MANUFACTURING MAGNETIC FIELD SHIELDING SHEET, AND ANTENNA MODULE USING SAME

TECHNICAL FIELD

The present disclosure relates to a magnetic field shielding sheet and, more specifically, to a magnetic field shielding sheet, a method of manufacturing a magnetic field shielding sheet, and an antenna module using the same, capable of improving the efficiency of an overall production process by improving a heat treatment process of a thin film magnetic sheet.

BACKGROUND ART

In wireless charging, wireless power transmission is performed using electromagnetic induction or magnetic resonance phenomenon between a wireless power transmission device and a wireless power reception device. In a portable electronic device such as a terminal for wireless power transmission, an antenna module including an antenna for communication and a signal processing unit, and a magnetic field shielding sheet are laminated on each other.

Transmission and reception for wireless power transmission uses a resonance circuit to increase efficiency, and a high quality factor (Q) is desirable to obtain frequency selectivity. The quality factor (Q) is proportional to the value of inductance (L) and inversely proportional to the value of resistance (R). Here, the magnetic field shielding sheet laminated on the antenna module functions as an inductor, thereby serving as an absorber to absorb radio waves, and serving as a magnetic shield to block influence on a terminal body.

Since the voltage induced in the wireless power reception device, that is, the secondary coil of the terminal, is determined by the Faraday's law and Lenz's law, the more the amount of magnetic flux linking with the secondary coil becomes, the more advantageous it is to obtain a high voltage signal. The amount of magnetic flux increases as the amount of soft magnetic material contained in the secondary coil increases and the magnetic permeability of the material increases. In particular, since the wireless charging is essentially a power transmission due to non-contact, it is necessary that the magnetic field shielding sheet on which the secondary coil is mounted is made of a magnetic material having a high magnetic permeability so as to focus the wireless electromagnetic wave generated in the primary coil of the wireless power transmission device into the secondary coil of the wireless power reception device.

In the case of an amorphous ribbon having a high magnetic permeability, since the ribbon itself is a metal thin sheet, there is no burden on the thickness, but when an AC magnetic field is applied to the amorphous ribbon according to the 100 kHz frequency used for power transmission, the application function is degraded due to the eddy current impact of the ribbon surface, or efficiency degradation and heat generation during wireless charging are generated.

The conventional magnetic field shielding sheet for a wireless power reception device is a thin film and considerably reduces the loss due to eddy current by the flake treatment for the amorphous ribbon, taking into account the heat generation problem caused by shielding and the problem of not increasing the wireless charging efficiency. As a result, a magnetic field shielding sheet for a wireless charger having excellent power transmission efficiency has been proposed by increasing the quality factor (Q) of the secondary coil while blocking the influence of the magnetic field on the main body and battery of a portable terminal device.

The magnetic field shielding sheet reduces eddy current loss by adopting a structure in which the thin film magnetic sheet is separated into a plurality of fine pieces by flake treatment with a protective film and double-sided tape attached to both sides of the thin film magnetic sheet. The flake-treated laminated sheet is laminated to flatten and slim the laminated sheet, and to insulate it by partially filling the adhesive through the gaps of fine pieces, thereby reducing eddy current and preventing oxidation of the amorphous ribbon.

Meanwhile, the wireless charging is classified into a magnetic induction method and a magnetic resonance method, and is classified into a Power Matters Alliance (PMA) method and a Qi method according to a method of sensing the access of the wireless power reception device with respect to the wireless power transmission device. The PMA wireless charging method controls the operation of the wireless power transmission device by detecting the proximity of the wireless power reception device using a permanent magnet and a Hall sensor.

In addition, in order to maximize the efficiency of the charger, there are many structures that employ a permanent magnet that helps the wireless power transmission device to align with the wireless power reception device. The thin shielding sheet is magnetized (saturated) by the DC magnetic field of the permanent magnet. As a result of the occurrence of the phenomenon, there is a problem that the performance is deteriorated or the power transmission efficiency is rapidly deteriorated.

Accordingly, when a permanent magnet is included in the wireless power transmission device, the magnetic field shielding sheet used in the wireless power transmission device is required to be laminated with a greater number of thin film magnetic sheets than the case where the permanent magnet is not included.

Meanwhile, the thin film magnetic sheet is subjected to heat treatment for the purpose of increasing the permeability, and when the heat treatment is performed, brittleness increases, so that the flaking treatment can be made more easily.

Accordingly, conventionally, a Fe-based amorphous ribbon in the form of a roll was manufactured by a rapid solidification process (RSP) by melt spinning, and then cut to a certain length to facilitate post-treatment after heat treatment, and then laminated in a sheet form. The resulting laminated ribbon sheet was heat treated in a batch manner.

For the purpose of facilitating post-treatment after heat treatment, the heat treatment for the laminated ribbon sheet in the form of a sheet cut to a predetermined length in a batch manner has a problem in that it is difficult to treat a mass-production of a roll-to-roll method at the time of a subsequent flake treatment and lamination treatment.

In addition, there is a method of manufacturing an amorphous ribbon in the form of a roll for heat treatment for the thin film magnetic sheet, and then performing heat treatment for the amorphous ribbon in a batch method in a wound roll form, but as brittleness increases while undergoing heat treatment, unwanted cracking occurs when unfolding the amorphous ribbon wound for the subsequent flake treatment, and thus there is a problem that subsequent processes cannot be processed by the roll-to-roll method.

Moreover, in recent years, antenna module companies have been supplied with magnetic field shielding sheets in the form of rolls, and want to use them by cutting (punching molding) magnetic field shielding sheets in the form of their desired patterns. However, there is a problem that cannot meet the needs.

DISCLOSURE

Technical Problem

Therefore, the present invention has been proposed to solve the problems of the conventional, the objective of which is to provide a magnetic field shielding sheet and a method of manufacturing the magnetic field shielding sheet capable of improving the efficiency of the overall production process by in-line heat treatment for a thin film magnetic sheet using a roll-to-roll process.

It is another objective of the present invention to provide a magnetic field shielding sheet and a method of manufacturing the magnetic field shielding sheet that can improve productivity and reduce manufacturing cost by processing a roll-to-roll process even during a subsequent flake process and lamination process by continuous heat treatment for a thin film magnetic sheet in a roll-to-roll process.

It is another objective of the present invention to provide a magnetic field shielding sheet prepared in a strip form and thus provided in a roll form wound on a roll shaft by sequentially performing heat treatment, insulating layer formation, flake treatment and laminating treatment for a thin film magnetic sheet by a roll-to-roll method, a method of manufacturing the magnetic field shielding sheet, and an antenna module using the same.

Technical Solution

To achieve the objective, a magnetic field shielding sheet according to the present invention comprises: at least one thin film magnetic sheet; an insulating layer or insulating layers formed on one side or either side of the at least one thin film magnetic sheet; and an adhesive layer formed between the insulating layers of the adjacent thin film magnetic sheets to laminate and bond the thin film magnetic sheets, wherein the thin film magnetic sheet is flake-treated to be divided into a plurality of magnetic substance fragments.

The insulating layer may partially penetrate or completely penetrate separation spaces between at least some fragments of the adjacent magnetic fragments, and the insulating layer may include an insulating layer forming composition containing a natural polymer compound and a synthetic polymer compound.

The magnetic field shielding sheet according to the present invention may be manufactured in a strip shape and provided in a roll shape wound around a roll shaft. In this case, the thickness of the thin film magnetic sheet may be 15 to 35 μm, preferably 15 to 20 μm, and the thin film magnetic sheet may be a magnetic substance of a thin plate made of an amorphous alloy or a nanocrystalline alloy.

The adhesive layer may be made of an acrylic adhesive and may have a thickness of 5 μm or less, preferably 3 μm or less. In addition, the thickness of the insulating layer may be 5 μm or less, preferably 3 μm or less.

In addition, the magnetic field shielding sheet according to the present invention further comprises a protective member and an adhesive member attached to the upper surface and the lower surface of the plurality of the laminated thin film magnetic sheets, respectively, wherein the adhesive member may include a first adhesive layer attached to the lower surface of the laminated thin film magnetic sheet and a release film for protecting the first adhesive layer until the magnetic field shielding sheet is attached to an adherend.

The magnetic field shielding sheet is used in combination with an antenna module for wireless power transmission, and when the wireless power transmission device includes a permanent magnet, a plurality of thin film magnetic sheets may be included therein.

According to another aspect of the present invention, a magnetic field shielding sheet comprises: at least one thin film magnetic sheet; an insulating layer or insulating layers formed on one side or both sides of the thin film magnetic sheet; and first and second sealing units respectively formed on side surfaces of one side and the other side of a magnetic sheet laminate in which the thin film magnetic sheet is laminated to seal the side surfaces, wherein the thin film magnetic sheet is flake-treated to be divided into a plurality of magnetic substance fragments.

According to another aspect of the present invention, a method of manufacturing a magnetic field shielding sheet, the method comprises: a first step for manufacturing a thin film magnetic sheet in a roll form; a second step for performing in-line heat treatment for the roll-shaped thin film magnetic sheet by using a heat treatment furnace and an insulator coating device sequentially arranged, and forming an insulating layer or insulating layers on one side or both sides of the heat-treated thin film magnetic sheet; a third step for forming a magnetic sheet laminate by laminating, into multiple layers, the thin film magnetic sheets on which the insulating layer or the insulating layers are formed; and a fourth step for flake-treating the magnetic sheet laminate to divide the thin film magnetic sheet into a plurality of magnetic substance fragments, wherein the second to fourth steps are performed by a roll-to-roll process using a roll-shaped thin film magnetic sheet.

The method of manufacturing a magnetic field shielding sheet according to the present invention can further comprise a step for forming an adhesive layer between the insulating layers of the thin film magnetic sheets so as to laminate and bond the thin film magnetic sheets when the magnetic sheet laminate is formed by laminating, into multiple layers, the thin film magnetic sheets on which the insulating layer or insulating layer are formed.

In addition, after performing the third step, the method may further include a step for laminating a temporary protection member on one side of the magnetic sheet laminate. After performing the third step or the fourth step, the method may further include a step for laminating a protective member and an adhesive member on both sides of the magnetic sheet laminate.

Furthermore, the present invention may further include a laminating step for flattening and reducing the thickness of the flake-treated magnetic sheet laminate after flake treatment for the magnetic sheet laminate.

The method of manufacturing a magnetic field shielding sheet according to the present invention may further include a sealing step for forming a magnetic sheet laminate by laminating the thin film magnetic sheet in multiple layers, and then sealing both sides of the magnetic sheet laminate.

According to another aspect of the present invention, an antenna module for wireless power reception comprises: an antenna for receiving wireless power; and a magnetic field shielding sheet disposed on one side of the antenna to improve antenna characteristics for wireless power reception and focusing magnetic flux toward the antenna.

Advantageous Effects

As described above, in the present invention, the efficiency of the overall production process can be improved by in-line heat treatment for the thin film magnetic sheet using a roll-to-roll process. In addition, the present invention continuously heat-treats the thin film magnetic sheet by a roll-to-roll method, and thus can perform even the subsequent flake process and lamination process through a roll-to-roll process, thereby improving productivity and reducing manufacturing costs.

Moreover, in the present invention, the in-line heat treatment for the thin film magnetic sheet, and the flake treatment and lamination treatment for the laminated multilayer thin film magnetic sheet can be all processed by a roll-to-roll process, providing a roll-shaped magnetic field shielding sheet required by antenna module business operators, etc.

BEST MODE

Hereinafter, embodiments of the present invention will be described in detail with reference to the accompanying drawings. The sizes and shapes of the components shown in the drawings may be exaggerated for clarity and convenience.

First, when the magnetic field shielding sheet according to the present invention is used for wireless charging, for example, a structure in which a plurality of thin film magnetic sheets are laminated may be employed in a wireless charging antenna module for wireless charging of a secondary battery in a portable terminal.

In particular, in the case that the wireless power transmitting device includes a permanent magnet, the wireless power reception device may require to use a magnetic sheet laminate formed by laminating the thin film magnetic sheets into 2 to 8 layers when the thin film magnetic sheets are made of a Fe-based amorphous alloy, and laminating the thin film magnetic sheets into 4 to 12 layers when the thin film magnetic sheets are made of a nanograin alloy.

In addition, when the wireless power transmission device does not include a permanent magnet, the wireless power reception device may require a laminated structure of 1 to 4 layers of a thin film magnetic sheet (Fe-based amorphous alloy or nanograin alloy).

However, the magnetic field shielding sheet according to the present invention can be applied to magnetic field shielding other than wireless charging.

In addition, in the following description of the embodiment, the magnetic field shielding sheet is described as an example in which a plurality of thin film magnetic sheets are laminated, but the magnetic field shielding sheet of the present invention may include a single thin film magnetic sheet.

In the following description of the embodiment, the "wireless power transmission device" may be simply referred to as a "wireless charger".

In addition, in the magnetic field shielding sheet according to the present invention, all the manufacturing processes of the present invention are performed in a strip form from a plurality of thin film sheet magnetic sheets, which are raw materials, to a magnetic field shielding sheet finally obtained through a strip shape to be wound on a roll shaft, thereby providing an antenna module provider with a roll-shaped winding body as a finished product. Therefore, all the terms "thin film magnetic sheet," "magnetic sheet laminate," and "magnetic field shielding sheet" refer to a strip-shaped sheet provided from a winding body.

Figure 1:
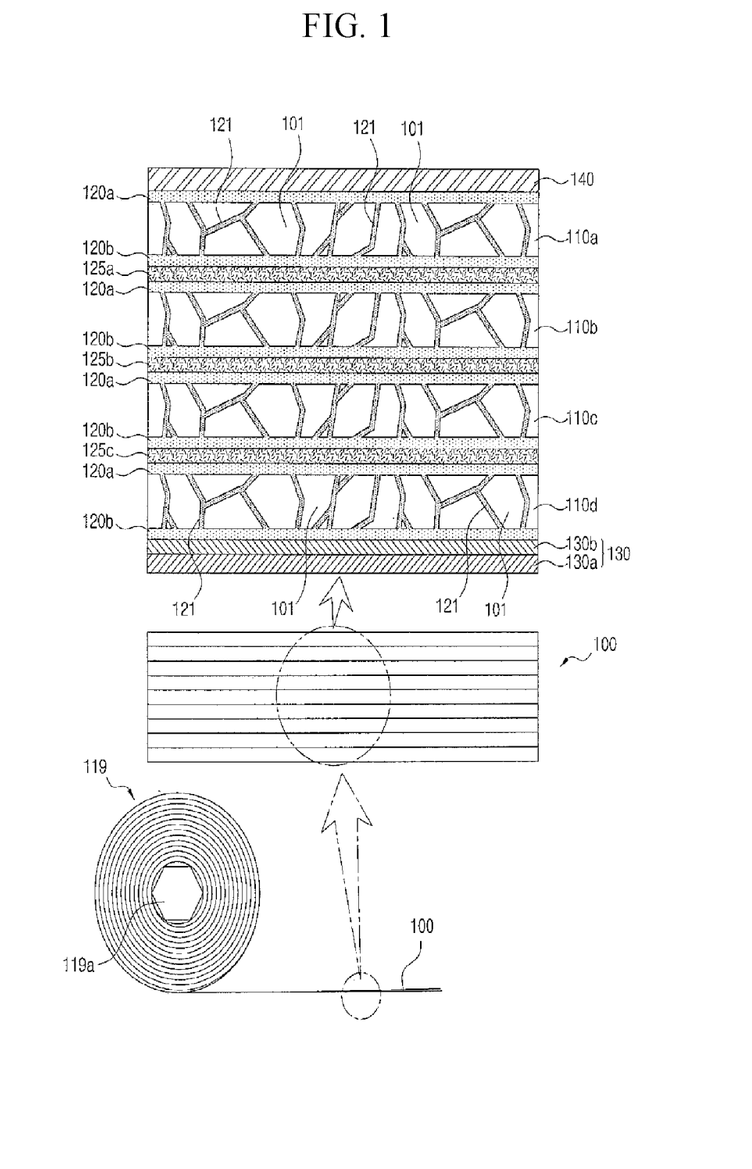
FIG. 1 is a cross-sectional view illustrating a magnetic field shielding sheet according to an embodiment of the present invention.

As shown in FIG. 1, the magnetic field shielding sheet 100 according to an embodiment of the present invention includes: a plurality of thin film magnetic sheets 110*a* to 110*d*; a plurality of pairs of insulating layers 120*a* and 120*b* formed on one side or both sides of the magnetic sheets 110*a* to 110*d*; and a plurality of adhesive layers 125*a* to 125*c* formed between the plurality of pairs of the insulating layers 120*a* and 120*b* to laminate and bond the plurality of thin film magnetic sheets 110*a* to 110*d*, wherein each of the thin film magnetic sheets 110*a* to 110*d* is flake-treated to be finely divided into a plurality of magnetic substance fragments 101 or partially cracked.

The shielding sheet 100 is a single body sheet in which a plurality of thin film magnetic sheets 110*a* to 110*d* provided with the insulating layers 120*a* and 120*b* formed on both sides or at least one side of each of the plurality of thin film magnetic sheets 110*a* to 110*d* are adhered to each other in a multilayer structure using a plurality of adhesive layers 125*a* to 125*c*.

The magnetic field shielding sheet 100 according to an embodiment of the present invention may further include a protection member 140 and an adhesive member 130 attached to the upper surface and the lower surface of the plurality of laminated thin film magnetic sheets 110*a* to 110*d*, respectively.

The adhesive member 130 may include a first adhesive layer 130*b* attached to the lower surface of the laminated thin film magnetic sheets 110*a* to 110*d* and a release film 130*a* to protect the first adhesive layer 130*b* until the magnetic field shielding sheet 100 is attached to an adherend.

The magnetic field shielding sheet 100 according to the present invention constitutes a winding body 119 that is manufactured in a strip shape and wound around a roll shaft 119*a* in a roll shape. Accordingly, an antenna module provider or the like using a magnetic field shielding sheet can receive a product of a roll-shaped winding body 119 and cut (punching molding) the magnetic field shielding sheet 100 in a desired pattern shape.

In addition, the magnetic field shielding sheet 100 according to an embodiment of the present invention is compressed while going through a flake treatment for dividing or cracking the thin film magnetic sheets 110a to 110d into a plurality of magnetic substance fragments 101, and a laminate process for flattening of the flake-treated laminated sheet and adjusting the thickness thereof. Part of the insulating layers 120a and 120b formed on both sides or at least one side of the plurality of thin film magnetic sheets 110a to 110d penetrate into the separation spaces existing between at least some of the adjacent magnetic substance fragments 101.

Insulating penetrating members 121 penetrated from the insulating layers 120a and 120b in the separation spaces between the magnetic substance fragments 101 may block the flow and separation of the fragments by increasing the supporting force of the fragments, and may perform a buffering function to prevent damage such as micro-fragmentation and breakage of the fragments caused by collision between the fragments when bending strength is applied to the shielding sheet.

In addition, when the insulating layers 120a and 120b partially or completely penetrate between the magnetic substance fragments 101, the insulating layers 120a and 120b and the insulating penetrating members 121 function as dielectrics, thereby providing an advantage capable of minimizing a magnetic loss by an eddy current. In this case, the magnetic substance provided in the thin film magnetic sheets 110a to 110d may be a magnetic substance (e.g., a magnetic substance such as a Fe—Si—B based amorphous alloy) having a low electric resistance to generate a magnetic loss due to an eddy current. In this case, the insulating penetrating members 121 penetrated into the separation spaces of the magnetic substance fragments 101 function as dielectrics and significantly increase the electrical resistance of the magnetic sheets, thereby preventing a magnetic loss due to an eddy current minimizing heat generation, and sustaining, with high sensitivity, the efficiency of transmitting and receiving signals through a magnetic field.

Hereinafter, a cross-sectional structure of the magnetic field shielding sheet according to an embodiment of the present invention will be described based on the case where the magnetic substance is an amorphous alloy.

Specifically, the thin film magnetic sheet 110a to 110d are formed of a plurality of magnetic substance fragments 101 obtained by crushing a magnetic substance in order to improve the flexibility of the magnetic field shielding sheet. The shapes of the magnetic substance fragments may be atypical.

The magnetic substance may be advantageous to have the shape of a ribbon sheet in the form of a strip so that the magnetic substance can be easily implemented as a thin film. In order to make the shielding sheet slimmer and thinner, the thickness of the magnetic substance provided should be very thin at the same time. The magnetic bodies provided in the normal shielding sheet are very brittle. As the thickness of the magnetic substance sheet becomes thin, the crack may occur or the magnetic substance sheet may be broken into fragments even due to a very weak external force. Therefore, there is a problem that the permeability decreases after the crack occurs rather than the permeability when the magnetic substance sheet is in the form of a sheet before the crack occurs.

In addition, the magnetic field shielding sheet implemented as a thin film has a problem of remarkably reducing workability when storing, transporting, and putting the magnetic field shielding sheet into a process as a part of a product after manufacturing. Specifically, the magnetic field shielding sheet is disposed on an adherend on which an antenna or the like is formed, and is generally attached so as to be in close contact with the adherend on which an antenna is formed in order to further improve antenna characteristics and prevent separation of the shielding sheet.

When this attachment process is described with reference to FIG. 1, the magnetic field shielding sheet 100 may be attached to an adherend (not shown) through the adhesive member 130, and for this purpose, a removal operation of the release film 130a for protecting the first adhesive layer 130b in the adhesive member 130 is performed. However, in order to peel the release film 130a from the shielding sheet 100, an external force of a certain level or more is required, but when the thickness of the shielding sheet is very thin, the sheet is easily and significantly cracked by the external force.

Accordingly, in order to prevent deterioration of physical properties due to cracks, a very great effort is applied to peeling off the release film so that cracks do not occur, thereby significantly reducing workability. In addition, even if a portable device is manufactured with great effort to prevent cracks from occurring in the shielding sheet, cracks or breaks may occur in the magnetic substance sheet due to impacts such as dropping during the user's handling of the product. As a result, there is a problem that a desired level of transmission and reception efficiency or transmission and reception distance cannot be guaranteed.

However, in order to remarkably improve the flexibility of the shielding sheet, the magnetic field shielding sheet 100 according to the present invention is provided with the magnetic substance which has been crushed from the beginning and provided in a state of fragments, and thus can fundamentally block a concern that more cracks may occur on the magnetic substance by an external force even if the cross-sectional thickness of the shielding sheet is thinned. In addition, the magnetic substance is included in the shielding sheet in a fragmented state, and the shielding sheet including the magnetic substance in the fragmented state has initial physical properties sufficient to express excellent characteristics at the transmission and reception efficiency and transmission and reception distance of signals related to a desired function from the beginning, and As the initial physical properties can be maintained continuously in the manufacturing stage of the finished product with the shielding sheet mounted, and furthermore in the use stage of the finished product, it is possible to eliminate the risks of deterioration in the physical properties due to unintended fragmentation occurring in the shielding sheet having a conventional non-fragmented magnetic substance and a significant decrease in the transmission and reception performance of signals due to the deterioration in the physical properties.

In order to further prevent unintentional damage, fragmentation, or breakage of additional magnetic substance fragments that may occur due to curving or bending of the magnetic sheet, preferably, at least one side of some fragments may be crushed to have a curved shape rather than a straight line.

There is a problem that physical properties such as a decrease in the magnetic permeability of the magnetic sheet may be caused because the fined fragments may increase compared to the fragments provided at the beginning due to external impact.

Meanwhile, the magnetic substance that may be included in the thin film magnetic sheets 110a to 110d according to the present invention has no limitation to the composition, crystal type, and microstructure of the sintered particles when the magnetic substance can express the magnetic permeability properties of the magnetic field shielding sheet to be described later in the fragmented state, and may safely adopt a magnetic substance provided in a known shielding sheet.

The magnetic substance may be a soft magnetic substance. The soft magnetic substance has extremely low coercivity with respect to the residual magnetic flux density and has a large magnetic permeability, thereby revealing excellent shielding effects against electromagnetic fields. The soft magnetic substance may include at least one selected from the group consisting of a Ni—Co-based alloy, a Fe—Ni-based alloy, a Fe—Cr-based alloy, a Fe—Al-based alloy, a Fe—Si-based alloy, a Fe—Si—B-based alloy, and a Fe—Si—B—Cu—Nb-based alloy.

In addition, the magnetic substance included in an embodiment of the present invention may employ a thin-film magnetic substance made of an amorphous alloy or a nanocrystalline alloy.

The amorphous alloy may employ a Fe-based or Co-based amorphous alloy, and it may be preferable to use the Fe-based amorphous alloy when the production cost is considered. The Fe-based amorphous alloy may employ, for example, a Fe—Si—B-based amorphous alloy, in which it is preferable that the content of Fe is 70 to 90 at %, and the sum of the content of Si and the content of B is 10 to 30 at %. The higher the content of metals including Fe, the higher the saturation magnetic flux density, but when the content of Fe element is excessive, it is difficult to form an amorphous material. Therefore, the content of Fe is preferably 70 to 90 at %. In addition, when the sum of the content of Si and the content of B is in the range of 10 to 30 at %, the amorphous formation ability of the alloy is the best. In order to prevent corrosion in the basic composition, a corrosion-resistant element such as Cr, Co, or the like may be added to within 20 at % and a small amount of other metal elements may be added as necessary to impart different characteristics. In addition, the Fe—Si—B-based alloy may have a crystallization temperature of 508° C. and a Curie temperature (Tc) of 399° C., for example. However, the crystallization temperature may vary depending on the content of Si and B, or other metal elements added in addition to the ternary alloy component, and the content thereof.

In addition, the magnetic substance included in an embodiment of the present invention may be a Fe—Si—B—Cu—Nb-based amorphous alloy. Copper included in the alloy improves the corrosion resistance of the alloy, and prevents the size of the crystal from being enlarged even if the crystal is formed. At the same time, it is possible to improve magnetic properties such as permeability. The copper is preferably contained in an alloy in an amount of 0.01 to 10 at %. However, there are problems that, if copper of an amount of less than 0.01 at % is included in the alloy, the expression of the effect obtained by copper may be insignificant, and if copper included in the alloy exceeds 10 at %, it may be difficult to generate the amorphous alloy. In addition, niobium (Nb) included in the alloy can improve magnetic properties such as permeability, and may be included in an alloy in an amount of 0.01 to 10 at %, and if niobium of less than 0.01 at % is included in the alloy, the expression of the effect obtained by niobium may be insignificant, and if niobium included in the alloy exceeds 10 at %, it may be difficult to generate the amorphous alloy.

The thickness of the thin film magnetic sheets 110a to 110d may be a thickness of the magnetic sheet which becomes the origin of fragments of the magnetic substance, preferably, the thickness of the thin film magnetic sheets 110a to 110d may be 15 to 35 μm, more preferably 15 to 20 m, in the case of a single layer, but is not limited thereto. The permeability of the sheet increases in proportion to the thickness.

In addition, the magnetic field shielding sheet 100 and the thin film magnetic sheets 110a to 110d are wound on the roll shaft 119a, so that the winding body 119 is supplied in a roll form, and users such as antenna module providers can cut the strip-type magnetic field shielding sheet 100 supplied in a roll form into a desired shape and use the magnetic field shielding sheet 100 cut in the desired shape.

That is, an application to which the magnetic field shielding sheet is applied, may be, for example, a wireless charging or near field communication (NFC) application, or the shape of the magnetic field shielding sheet may be a polygonal shape such as a pentagon in addition to a quadrangle of a rectangle or square, a circular or oval shape, or a shape of partially mixed curves and straight lines, in correspondence to a shape of an antenna of a complex function that performs wireless charging and near field communication (NFC) at the same time. Here, the size of the shielding sheet (or magnetic sheet) is preferably made of about 1 to 2 mm wider than the size of the antenna of the corresponding module.

Next, the insulating layers 120a and 120b formed on at least one side of the above-described thin film magnetic sheets 110a to 110d will be described.

The insulating layers 120a and 120b fix and support each of the magnetic substance fragments so that the magnetic substance fragments that can be crushed and separated may become one layer to maintain the thin film magnetic sheets 110a to 110d in a sheet shape, and at the same time, to buffer the external force applied to the magnetic substance fragments and play a role of preventing the magnetic substance from being oxidized by moisture penetration.

Specifically, the insulating layers 120a and 120b can employ materials as preferred thin film insulating layers without limitation, which can be easily adhered to magnetic substance fragments, have excellent retention force in a sheet shape as the coating layer itself, have excellent coating properties to be implemented as a thin film with no remarkably low flexural properties which cause to be easily broken by the external force or reduce the flexibility of the thin film magnetic sheets 110a to 110d, and do not degrade workability due to a small amount of tacky properties at room temperature.

The insulating layers 120a and 120b may be formed by solidifying a composition for forming an insulating layer including at least one of a natural polymer compound and a synthetic polymer compound. A method of solidifying the insulating layer forming composition is not particularly limited. For example, the solidification reaction can employ any of drying by solvent volatilization or solidification by hardening, solidification through hardening by chemical reaction through heat/light/moisture, etc., and solidification by cooling after thermal melting such as a hot melt type, without limitation.

Specifically, the natural polymer compound may be one or more of protein-based polymer compounds such as glue and gelatin, carbohydrate-based polymer compounds such as starch, cellulose and derivatives thereof, and complex polysaccharides, and natural rubber-based compounds such as latex.

In addition, the synthetic polymer compound may include any one or more of a thermoplastic polymer compound, a thermosetting polymer compound, and a rubber-based compound.

The thermoplastic polymer compound may include one or more of polyethylene, polypropylene, polystyrene, polyvinyl chloride, polyacrylonitrile resin, acrylonitrile-butadiene-styrene (ABS), styrene-acrylonitrile (SAN), acrylic resin, methacrylic resin, polyamide, thermoplastic polyester (e.g. polyethylene terephthalate (PET), polybutylene terephthalate (PBT), etc.), polycarbonate, polyphenylene sulfide resin, polyamideimide, polyvinylbutyral, polyvinyl formal, polyhydroxypolyether, polyether, polyphthalamide, fluorinated resin (e.g. polytetrafluoroethylene (PTFE) and polychlorotrifluoroethylene (PCTFE)), phenoxy resin, polyurethane-based resin, nitrile butadiene resin, and the like. In addition, the thermosetting polymer compound may include one or more of a phenol resin (PE), a urea resin (UF), a melamine resin (MF), an unsaturated polyester resin (UP), an epoxy resin, and the like. In addition, the rubber-based compound may include one or more of styrene-butadiene rubber (SBR), polybutadiene rubber (BR), acrylonitrile-butadiene rubber (NBR), polyisobutylene (PIB) rubber, acrylic rubber, fluorine rubber, silicone rubber, chloroprene, and the like.

The insulating layers 120a and 120b are more preferably formed by solidifying a rubber-based compound in order to prevent unintentional micro-fragmentation of the magnetic substance by improving the buffering function of the insulating layer and further improve the flexibility of the magnetic field shielding sheet. The rubber-based compound may be more preferably a polymer in which ethylene-propylene-diene monomer (EPDM) rubber is copolymerized.

When the insulating layer forming composition forming the insulating layers 120a and 120b is solidified through a curing reaction, a curable component capable of curing the above-described polymer compound may be further included, and in some cases, a solvent and a curing accelerator may be further included.

In addition, the insulating layer forming composition may include, if necessary, one kind or two or more kinds of various additives such as a pH adjuster, an ion trapping agent, a viscosity adjuster, a thixotropic agent, an antioxidant, a heat stabilizer, a light stabilizer, an ultraviolet absorber, a colorant, a dehydrating agent, a flame retardant, an antistatic agent, an anti-repellent, a preservative, and the like.

Moreover, the thickness of the insulating layers 120a and 120b is preferably implemented within 5 μm, and preferably 3 μm or less than in terms of thickness reduction. However, when the thickness of the insulating layer is less than 3 μm, the separation and movement of the magnetic substance fragments cannot be prevented, the mechanical strength is so weak that the insulating layer can be torn, and the insulating layer can be torn or damaged by the fragments.

Meanwhile, as shown in FIG. 1, the magnetic field shielding sheet 100 according to the present invention may further include a protective member 140 arranged on an upper portion of the laminate of the plurality of thin film magnetic sheets 110a to 110d and an adhesive member 130 having a release film 130a and a first adhesive layer 130b formed on one surface of the release film 130a, which is arranged on a lower portion of the laminate of the plurality of thin film magnetic sheets 110a to 110d.

First, the protective member 140 prevents external force from being directly applied to the magnetic substance in a process of crushing the magnetic substance sheet, and prevents the magnetic substance powder generated during the crushing process from scattering, to help maintain the workplace environment comfortably. In addition, in the process of attaching the magnetic field shielding sheet to a flexible substrate FPCB on which the antenna pattern is formed, the magnetic field shielding sheet is protected from heat/pressure, etc., applied to cure the adhesive.

The protective member 140 may be a protective film typically provided in the magnetic field shielding sheet, and may be used without limitation in the case of a protective member made of a material having heat resistance enough to withstand heat or external force applied in the crushing process for the magnetic substance sheet or the attachment process for the magnetic field shielding sheet and a mechanical strength and chemical resistance sufficient to protect the thin film magnetic sheets 110a to 110d against physical and chemical stimuli applied from the outside. As a non-limiting example for the material of the protective member, a film, such as polyethylene, polypropylene, polyimide, crosslinked polypropylene, nylon, polyurethane-based resin, acetate, polybenzimidazole, polyimide amide, polyetherimide, polyphenylene sulfide (PPS) polyethylene terephthalate (PET), polytrimethylene terephthalate (PTT), and polybutylene terephthalate (PBT), polyvinylidene fluoride (PVDF), polytetrafluoroethylene (PTFE), and polychlorotrifluoroethylene (PCTFE), and polyethylene tetrafluoro ethylene (ETFE) can be used alone or in combination.

In addition, the protective member 140 may have a thickness of 1 to 100 μm, preferably 10 to 30 μm, but is not limited thereto.

Moreover, the protective member 140 may be directly attached to the top insulating layer 120a of the laminate of the plurality of thin film magnetic sheets 110a to 110d without a separate adhesive member, or may be adhered through a separate adhesive member. However, in order to reduce the thickness of the magnetic field shielding sheet, it is preferable to be directly attached to the insulating layer 120a without intervening an adhesive member.

Next, the adhesive member 130 serves to attach the magnetic field shielding sheet 100 to an antenna or a substrate with an antenna. As shown in FIG. 1, the adhesive member 130 may include the first adhesive layer 130b for attaching the magnetic field shielding sheet 100 to an adherend, and may further include the release film 130a for protecting the first adhesive layer 130b. The release film 130a may be used without limitation in the case of a conventional known release film that can be easily removed from the first adhesive layer 130b, but the present invention is not particularly limited thereto. Before the magnetic field shielding sheet is attached to the final adherend, the release film 130a may be removed from the magnetic field shielding sheet 100.

The first adhesive layer 130b is formed by applying an adhesive layer forming composition to the lowermost portion of the thin film magnetic sheets 110a to 110d, or the first adhesive layer 130b is formed by applying an adhesive layer forming composition on the release film 130a. The first adhesive layer 130b may be provided to be attached to the lowermost portion of the thin film magnetic sheets 110a to 110d. In addition, the first adhesive layer 130b may be a double-sided adhesive layer, for example, a double-sided tape, in which an adhesive layer forming composition is coated on either side of a support film for reinforcement of mechanical strength.

Hereinafter, a method of manufacturing a magnetic field shielding sheet according to an embodiment of the present invention described above will be described with reference to FIG. 2.

Figure 2:
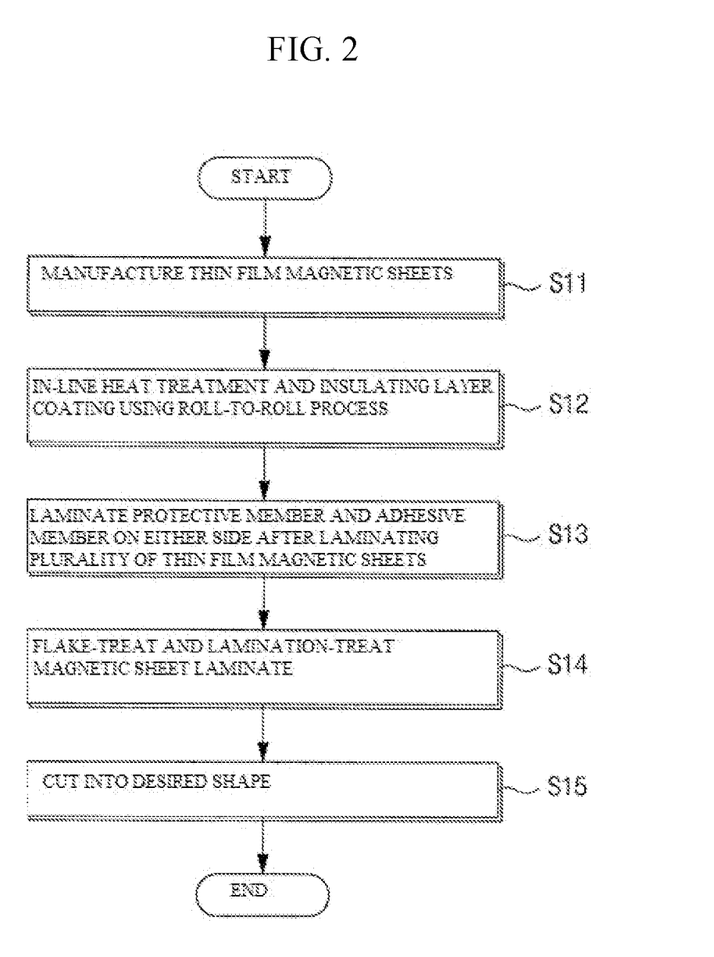
FIG. 2 is a flowchart illustrating a method of manufacturing a magnetic field shielding sheet according to an embodiment of the present invention.

A method of manufacturing a magnetic field shielding sheet according to an embodiment of the present invention includes: a first step (S11) for manufacturing thin film magnetic sheets 110a to 110d in a roll form; a second step (S12) for performing in-line heat treatment using a roll-to-roll process for a plurality of roll-shaped thin film magnetic sheets 110a to 110d and forming insulating layers 120a and 120b on one or both sides of the thin film magnetic sheets 110a to 110d by using a heat treatment furnace 200 and an insulator coating device 205 which are arranged in sequence; a third step (S13) for forming a magnetic sheet laminate 100a by stacking, in multiple layers, the thin film magnetic sheets 110a to 110d on which the insulating layers 120a and 120b are formed, and stacking the protective member 140 and the adhesive member 130 on both sides of the multiple layered thin film magnetic sheets 110a to 110d; and a fourth step (S14) for finely dividing the thin film magnetic sheets 110a to 110d into a plurality of magnetic substance fragments 101 by sequentially performing flake treatment and laminating treatment for the magnetic sheet laminate 100a. However, the present invention is not limited thereto.

Hereinafter, the method of manufacturing the magnetic field shielding sheet according to the present invention will be described in detail for each process.

First, in the first step (S11) for manufacturing the thin film magnetic sheets 110a to 110d in a roll form, an amorphous ribbon made of a metallic alloy is manufactured by the rapid solidification process (RSP) by melt spinning method. In this case, the amorphous ribbon manufactured by the rapid solidification process (RSP) by melt spinning method has a constant width and is obtained in the form of a continuous strip. When the strip-shaped thin film magnetic sheets 110a to 110d are respectively wound on the roll shafts 115a, the roll-shaped winding bodies 111 can be obtained.

When the amorphous ribbon is an Fe—Si—B alloy, for example, the thin film magnetic sheets 110a to 110d of 30 μm or less made of an Fe—Si—B alloy are wound around the roll shafts 115a to form rolls. In addition, when the amorphous ribbon is made of a Fe—Si—B—Cu—Nb alloy, the thin film magnetic sheets 110a to 110d of 30 μm or less made of an Fe—Si—B—Cu—Nb alloy are wound to the roll shafts 115a to form rolls.

Figure 3:
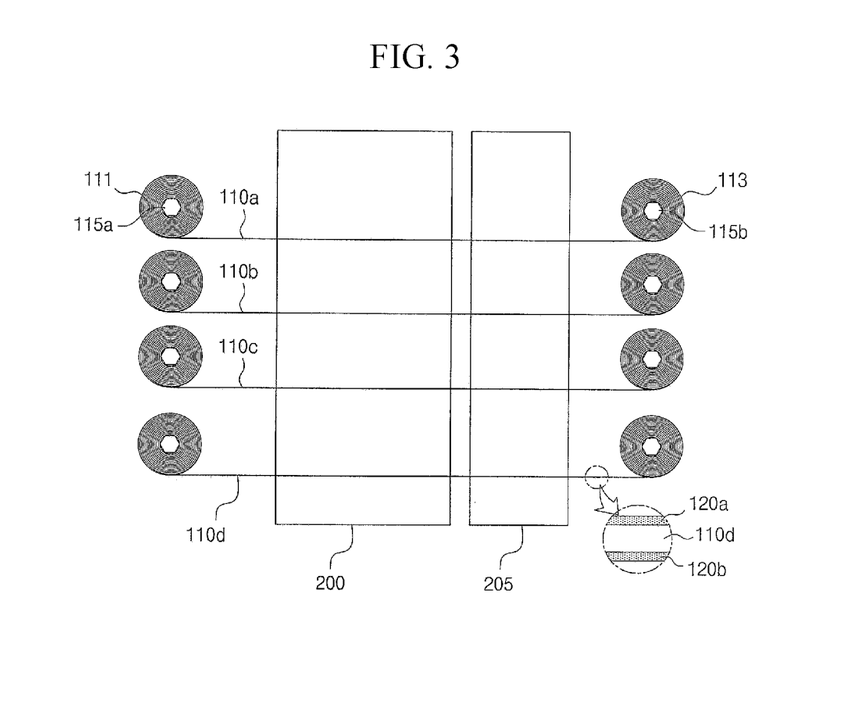
FIG. 3 is a schematic diagram illustrating an in-line heat treatment process for a magnetic field shielding sheet according to an embodiment of the present invention.

Subsequently, as shown in FIG. 3, a plurality of thin film magnetic sheets 110a to 110d are installed to simultaneously pass in an in-line facility in which the heat treatment furnace 200 and the insulator coating device 205 are sequentially arranged to perform the second step (S12) of performing in-line heat treatment and insulating layer coating using a roll-to-roll process.

To this end, a plurality of winding bodies 111 in which thin film magnetic sheets 110a to 110d are respectively wound on the roll shafts 115a are arranged at the front end of the heat treatment furnace 200, and the leading ends of the thin film magnetic sheets 110a to 110d supplied therefrom pass through the heat treatment furnace 200 and the insulator coating device 205, and then winding reels (not shown) are arranged at the rear end of the insulator coating device 205 to be wound on the roll shafts 115b that are wound and driven by a driving motor (not shown).

In this case, the heat treatment furnace 200 is, for example, an in-line heat treatment device composed of a continuous furnace having a length of 20 to 30 m, and the insulator coating device 205 may be implemented as equipment coating any one of, for example, a thermoplastic polymer compound, a thermosetting polymer compound, and a rubber based compound, using a bar coater.

In this state, the Fe-based amorphous ribbons, for example, the thin film magnetic sheets 110a to 110d made of an Fe—Si—B alloy undergo heat treatment performed in a temperature range of 300° C. to 600° C., preferably 300° C. to 400° C. to obtain a desired permeability. In this case, the heat treatment may be performed in the heat treatment atmosphere such as a nitrogen atmosphere or the air.

When the heat treatment temperature is less than 300° C., the heat treatment time should be long since the stress relief of the internal stress generated during the manufacturing of the magnetic sheet is not perfectly performed, and when the heat treatment temperature exceeds 600° C., crystallization is rapidly performed inside the magnetic sheet by the overheating process, and thus the permeability of the magnetic sheet is remarkably lowered, thereby not exhibiting a desired permeability.

In addition, when the amorphous ribbons are made of an Fe—Si—B—Cu—Nb alloy, the thin film magnetic sheets 110a to 110d made of the an Fe—Si—B—Cu—Nb alloy ribbon, for example, undergo heat treatment in a temperature range of 300° C. to 700° C., preferably 400° C. to 550° C. to obtain a ribbon sheet having nanocrystalline microstructure in which nanocrystal grains are formed.

In this case, since the heat treatment atmosphere has a Fe content of 70 at % or more, oxidation occurs when the heat treatment is performed in the air, which is not preferable from a visual point of view, and therefore, the heat treatment is preferably made in a nitrogen atmosphere.

In this case, when the heat treatment temperature is less than 300° C., nanocrystal grains are not sufficiently generated, so that the desired permeability is not obtained, and thus there is a problem in that the heat treatment time is long. Meanwhile, when the heat treatment temperature exceeds 700° C., there is a problem in that the permeability is significantly lowered by overheating.

When the thin film magnetic sheets 110a to 110d are made to be wound on the roll shafts 115b of the winding reels disposed at the rear end of the insulator coating device 205 at a preset speed by a driving motor, the thin film magnetic sheets 110a to 110d wound on the roll shafts 115a at the front end of the heat treatment furnace 200 are unwound from the winding bodies 111, and the in-line heat treatment for improving the permeability while passing through the heat treatment furnace 200 and the insulator coating device 205 at a preset feed rate. Thereafter, the coating of the insulating layers 120a and 120b can be made on one or both sides of the thin film magnetic sheets 110a to 110d.

In the above description of the embodiment, it has been exemplified that the insulating layers 120a and 120b are formed immediately after the heat treatment for the thin film magnetic sheets 110a to 110d, but the insulating layers 120a and 120b may be formed by a separate process.

The heat treatment furnace 200 is a furnace for continuously processing, maintaining, cooling, etc. for each section from an inlet, and then discharging the same via an outlet.

The thin film magnetic sheets 110a to 110d are, for example, Fe—Si—B—Co—Ni-based amorphous alloy ribbons manufactured by the rapid solidification process (RSP) by melt spinning, in which ribbon strips having a thickness of 24 μm undergo non-magnetic heat treatment in the heat treatment furnace 200 in the air atmosphere of about 460° C. In the insulator coating device 205, an insulating layer forming composition in which 9% by weight of ethylenepropylene-diene rubber (EPDM) and 91% by weight of toluene are mixed is coated with a bar coater, and dried. Thus, an insulating layer having a thickness of 3 µm or so can be formed.

The plurality of thin film magnetic sheets 110a to 110d passing through the insulator coating device 210 are wound in a roll form on the roll shaft 115b of the winding reel in a state in which the insulating layers 120a and 120b are coated on one or both sides thereof, respectively, to form the winding body 113.

Thereafter, according to the third step (S13), a plurality of thin film magnetic sheets 110a to 110d are laminated in an appropriate number according to the purpose to which the magnetic field shielding sheet 100 is applied to form a magnetic sheet laminate 100a. In the description of the embodiment illustrated in FIGS. 4A and 4B, an example of laminating four thin film magnetic sheets 110a to 110d having insulating layers 120a and 120b formed on both sides thereof will be described.

Figure 4A:
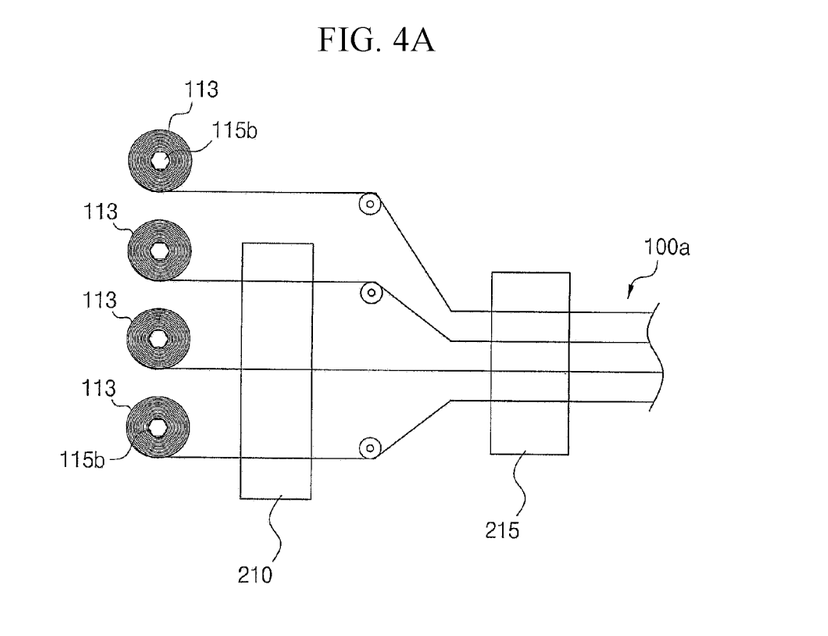
FIG. 4A is a schematic process diagram illustrating a process of manufacturing a magnetic sheet laminate by laminating a plurality of thin film magnetic sheets for a flake process after a heat treatment process for the magnetic field shielding sheet and FIG. 4B is a cross-sectional views of the magnetic sheet laminate according to an embodiment of the present invention.
Figure 4B:
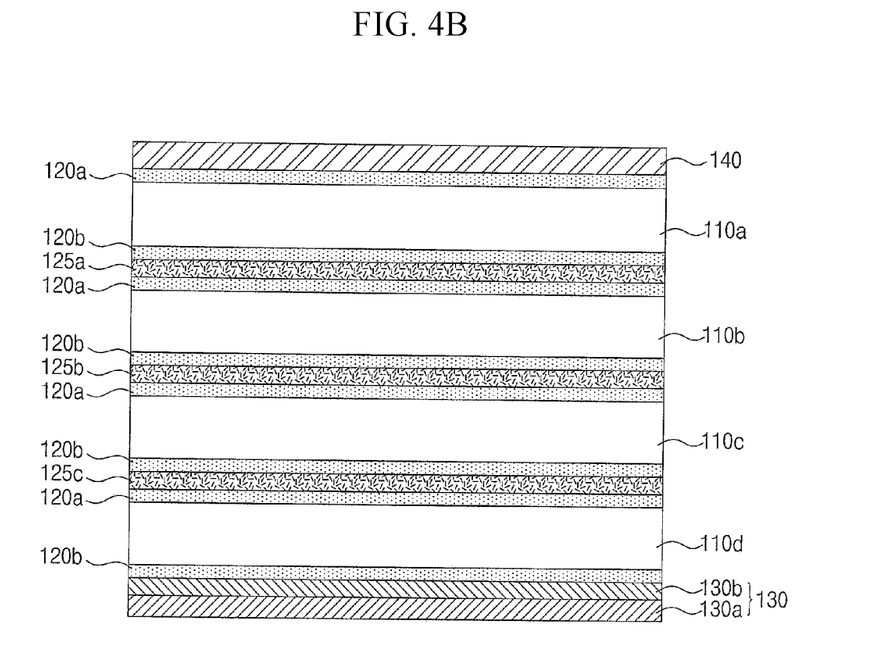

In this case, adhesive layers 125a to 125c are formed between the thin film magnetic sheets 110a to 110d on which the insulating layers 120a and 120b are formed to form a unitary body by mutual adhesion, and the protective member 140 is laminated on one side of the four-layer laminate, and the adhesive member 130 is laminated on the other surface thereof, respectively.

The adhesive layers 125a to 125c may be known adhesives, and non-limiting examples thereof may include adhesives such as acrylic, urethane, and epoxy. In particular, the adhesive layers 125a to 125c are each made of an inorganic material type acrylic adhesive, and may have a thickness of 5 µm or less, preferably 3 µm or less.

The third step (S13) for forming the magnetic sheet laminate 100a by stacking a plurality of thin film magnetic sheets 110a to 110d may also be performed in a roll-to-roll process.

After preparing four thin film magnetic sheets 110a to 110d on both sides of which are formed the insulating layers 120a and 120b obtained in the second step (S12) in the form of rolls each having a winding body 113 formed on the roll shafts 115b, first, adhesive layers 125a to 125c are applied by applying an adhesive to one or both sides of the three thin film magnetic sheets 110b to 110d using an adhesive coating machine 210. Subsequently, when the protective member 140, the four thin film magnetic sheets 110a to 110d, and the adhesive member 130 are laminated in the order thereof using a laminating machine 215, the roll-shaped magnetic sheet laminate 100a can be obtained.

In the description of the embodiment shown in FIGS. 4A and 4B above, it has been exemplified that the single magnetic sheet laminate 100a is formed by laminating four thin film magnetic sheets 110a to 110d in which the insulating layers 120a and 120b are formed on both sides thereof with the adhesive layers 125a to 125c inserted between the four thin film magnetic sheets 110a to 110d, but the present invention may be modified into other structures.

Figure 5:
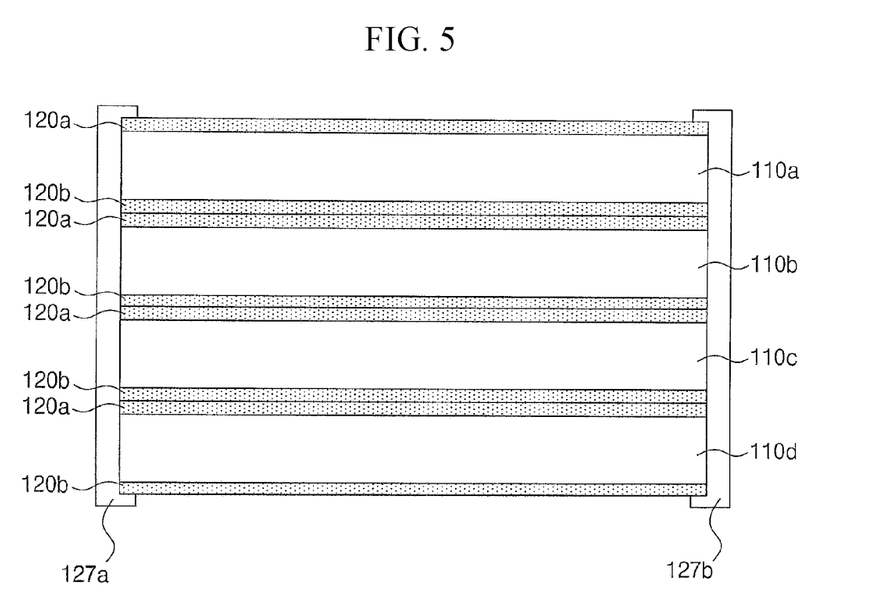
FIG. 5 is a cross-sectional view illustrating a magnetic sheet laminate in which a plurality of thin film magnetic sheets are laminated for a flake process after a heat treatment process for a magnetic field shielding sheet according to another embodiment of the present invention.

According to another embodiment shown in FIG. 5, in the magnetic sheet laminate, after laminating four thin film magnetic sheets 110a to 110d having insulating layers 120a and 120b formed on both sides thereof, both sides of the laminated thin film magnetic sheets 110a to 110d may be coated with a sealing agent to form first and second sealing portions 127a and 127b.

In this case, the first and second sealing portions 127a and 127b are formed to cover part of the upper and lower surfaces of the laminated thin film magnetic sheets 110a to 110d, and thus may be configured to prevent leakage into the laminated magnetic sheet laminate in which the plurality of thin film magnetic sheets 110a to 110d have been laminated and to be integrated with the laminated thin film magnetic sheets 110a to 110d.

The material that can be used as the sealant may be silicon, epoxy, or the like, and the present invention is not particularly limited thereto, and a known sealant can be used without limitation.

After preparing the magnetic sheet laminate (100a) as described above, flake treatment and laminating treatment are sequentially performed to finely divide the thin film magnetic sheets 110a to 110d into a plurality of magnetic substance fragments 101, and then the fourth step (S14) is performed to reduce thickness together with the planarization.

Figure 6A:
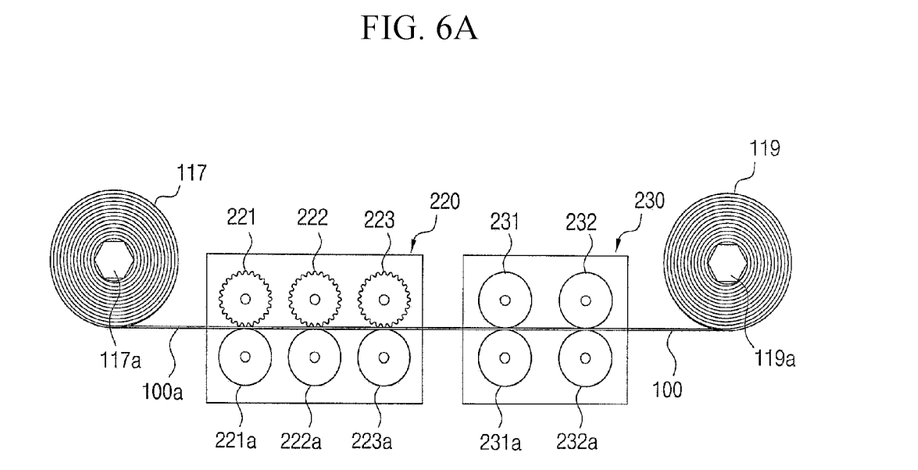
FIGS. 6A and 6B are a schematic process sectional view and an enlarged view illustrating a flake-treatment process and a laminate process for a magnetic sheet laminate according to an embodiment of the present invention.
Figure 6B:
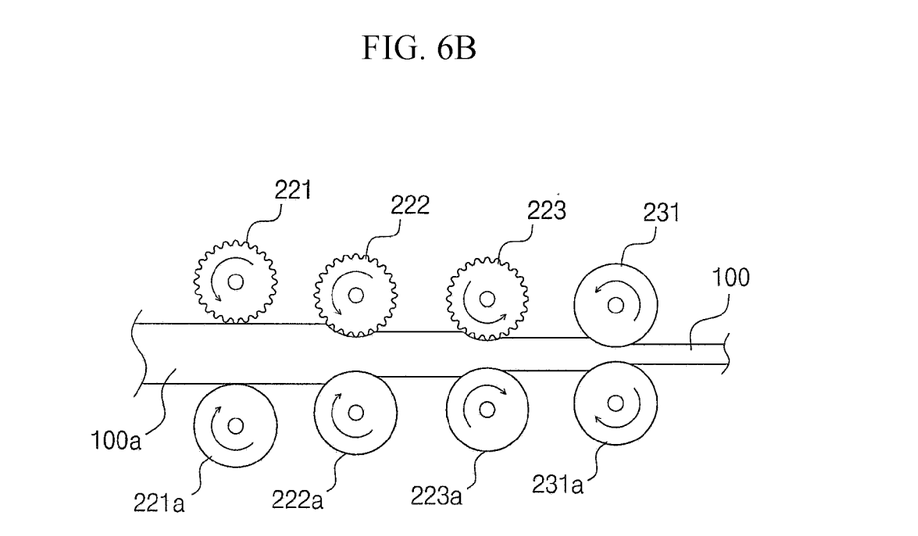

In the present invention, the flake process and the lamination process of the magnetic sheet laminate may be successively performed in a roll-to-roll manner using the flake device 220 and the lamination device 230 shown in FIGS. 6A and 6B.

Referring to FIGS. 6A and 6B, the flake device 220 and the lamination device 230 according to the present invention are continuously arranged, a strip-shaped magnetic sheet laminate 100a is supplied from the winding body 117 wound on the roll shaft 117a to the front end of the flake device 220, and the magnetic field shielding sheet 100 in the form of a strip that has undergone the flake process and the lamination process is discharged at the rear end of the lamination device 230, to then be wound in a roll shape on a roll shaft 119a driven by a driving motor to form a winding body 119.

The method of flaking the thin film magnetic sheets 110a to 110d of the magnetic sheet laminate 100a into a plurality of magnetic material fragments 101 may be adopted and used without limitation in the case of a known method of crushing a thin film magnetic sheet (i.e., magnetic substance). As an example, the thin film magnetic sheet may be passed through a flake device (i.e., a crushing device) to crush the thin film magnetic sheet into irregular fragments, and Thereafter, pressure is applied to flatten the magnetic sheet laminate 100a so that the aggregate of magnetic substance fragments has a desired thickness, and at the same time, the separation spaces between the magnetic substance fragments can be reduced.

The method of applying pressure to the plurality of magnetic substance fragments 101 may be performed in a manner of applying pressure to the crushed fragments together with crushing in a flake device, or in a manner of further performing a pressing process by using a separate lamination device after crushing the magnetic substance.

As shown in FIGS. 6A and 6B, the flake device 220 includes a plurality of crushing rollers 221 to 223 rotatably supported between opposite partition walls and a plurality of pressing rollers 221a to 223a arranged below the crushing rollers 221 to 223 and being in contact with the crushing rollers 221 to 223.

The plurality of crushing rollers 221 to 223 have a plurality of irregularities formed along the axial direction on the outer circumferences thereof, and there is no particular limitation on the structure of the irregularities. The plurality of crushing rollers 221 to 223 may be provided with a plurality of spherical balls mounted on the outer circumferences thereof, instead of a plurality of irregularities formed on the outer circumferences thereof. The plurality of pressing rollers 221a to 223a may be configured as rubber rollers capable of receiving pressure from the crushing rollers 221 to 223.

Although the crushing rollers 221 to 223 composed of three have been illustrated in FIGS. 6A and 6B, the required size of the magnetic substance fragments 101 may vary according to the thickness of the magnetic sheet laminate 100a, the lamination number of the thin film magnetic sheets 110a to 110d, and the environment in which the magnetic field shielding sheet 100 is applied, and accordingly, the number of the crushing rollers 221 to 223 can be variously modified.

Figure 7:
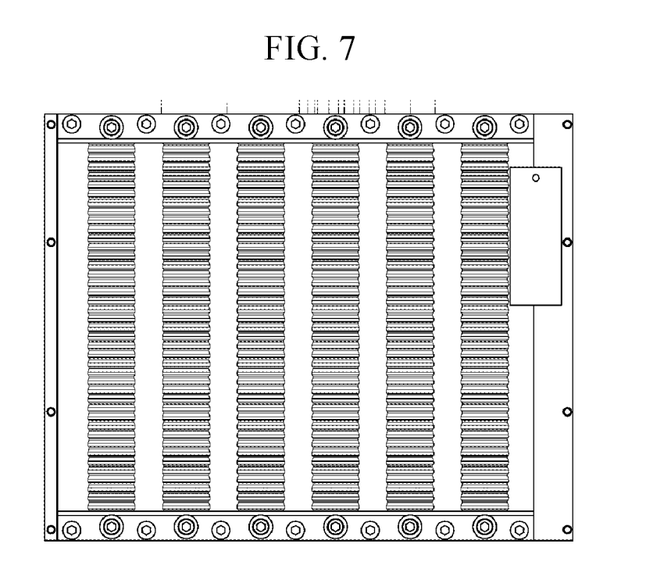
FIG. 7 is a pictorial plan view illustrating a flake processing apparatus of a magnetic field shielding sheet according to an embodiment of the present invention.

FIG. 7 is a photograph showing that the crushing rollers consist of six rows.

When the roll shaft 119a driven by a driving motor disposed at the rear end of the lamination device 230 to flake (crush) the thin film magnetic sheet (i.e., magnetic substance) is rotated at a predetermined speed, a strip-shaped magnetic sheet laminate 100a is supplied from the winding body 117 located at the front end of the flake device 220 to pass through the flake device 220.

As a result, the thin film magnetic sheets 110a to 110d of the magnetic sheet laminate 100a that has passed through the flake device 220 are divided or cracked into a plurality of magnetic substance fragments 101.

When the flake treatment is configured in multiple stages, and the gaps between the crushing rollers 221 to 223 and the pressing rollers 221a to 223a are set to be narrower toward the rear end, the magnetic substance fragments of the thin film magnetic sheets 110a to 110d become smaller in size, and the magnetic sheet laminate 100a can be planarized and the thickness of the magnetic sheet laminate 100a can be gradually reduced.

In addition, as the thin film magnetic sheets 110a to 110d are divided into a plurality of magnetic substance fragments 101 via the flake treatment, Some of the insulating layers 120a and 120b formed on both sides or at least one side of the plurality of thin film magnetic sheet 110a to 110d may penetrate into the separation spaces existing between at least some of the adjacent magnetic substance fragments 101, but there is not enough penetration.

Moreover, if the insulating layers 120a and 120b are insufficient to penetrate into the separation space, the magnetic substance fragments 101 contact each other according to the flow of the magnetic substance fragments 101, and the size of the magnetic substance fragments 101 increases, resulting in an increase in eddy current loss and changes in permeability.

Therefore, in order to prevent such a phenomenon, it is preferable that a lamination process is followed in order for a part of the insulating layers 120a and 120b to sufficiently penetrate between the adjacent magnetic substance fragments 101 and flatten the sheets.

The lamination device 230 disposed at the rear end of the flake device 220 includes one or more upper rollers 231 and 232 and one or more lower rollers 231a and 232a corresponding thereto. The upper rollers 231 and 232 and the lower rollers 231a and 232a may be configured as pressure rollers.

The magnetic sheet laminate 100a which is obtained by dividing or cracking the thin film magnetic sheets 110a to 110d into a plurality of magnetic substance fragments 101 while passing through the flake device 220, is further pressed while passing through the lamination device 230.

As a result, the magnetic field shielding sheet 100 discharged through the lamination device 230 is compressed while undergoing a lamination treatment as shown in FIG. 1 to achieve flattening and thickness control of the sheet, and simultaneously part of the insulating layers 120a and 120b, that is, the insulating penetrating members 121 formed on both sides or at least one side of the plurality of thin film magnetic sheets 110a to 110d penetrate into the separation spaces existing between at least some of the adjacent magnetic substance fragments 101.

As a result, the insulating penetrating members 121 penetrated from the insulating layers 120a and 120b in the separation spaces between the magnetic substance fragments 101 may block the flow and separation of the fragments by increasing the supporting force of the fragments, and may perform a buffering function to prevent damage such as micro-fragmentation and breakage of the fragments caused by collision between the fragments when bending strength is applied to the shielding sheet.

According to an embodiment of the present invention, the shape of the magnetic substance fragments crushed through the flake step may be atypical. However, in order to further prevent unintended additional damage, fragmentation, or breakage of the magnetic substance fragments that may occur due to curving or bending of the manufactured shielding sheet, preferably, at least one side of some fragments may be crushed to have a curved shape rather than a straight line.

Meanwhile, in the above description of the embodiment, when performing the flake treatment and the laminating treatment, a plurality of thin film magnetic sheets 110a to 110d are laminated using a plurality of adhesive layers 125a to 125c, and then the protective member 140 is laminated on one side of the laminate, and the adhesive member 130 is laminated on the other side thereof, to obtain the magnetic sheet laminate 100a.

However, in the present invention, the protection member 140 and the adhesive member 130 are not attached to both sides of the laminate, and only the laminate of the plurality of thin film sheet magnetic sheets 110a to 110d may be carried out or the temporary protection member may be attached to only the upper surface of the laminate in contact with the crushing rollers 221 to 223. Otherwise, the flake treatment and the laminating treatment may be performed in a state in which the temporary protection members are attached to both sides of the laminate in contact with the crushing rollers 221 to 223.

When the temporary protection member is laminated and subjected to flake treatment and laminating treatment, the temporary protection member is peeled off and a protective member 140 is laminated on one side of the laminate and an adhesive member 130 is laminated on the other side thereof to complete the magnetic field shielding sheet.

The temporary protection member prevents scattering and loss of the crushed magnetic substance, thereby providing an advantage of making the workplace environment comfortable and preventing a material cost rise due to a lost magnetic material. The temporary protection member may be provided with an adhesive layer on one surface thereof, so as to pass through a crushing device while being physically placed on the magnetic substance without being temporarily adhered to or attached to the magnetic substance. The temporary protective member may be a conventional PET film, paper, or the like and is not particularly limited to a material.

As described above, in the magnetic field shielding sheet 100 according to an embodiment of the present invention, the entire manufacturing process is performed in a roll-to-roll manner, and finally, as shown in FIG. 1, the magnetic field shielding sheet 100 is wound on the roll shaft 119a to be provided as a roll-shaped winding body 119.

The magnetic field shielding sheet 100 according to an embodiment of the present invention described above can also be implemented as a complex magnetic field unit by combining other magnetic field shielding sheets having different magnetic properties at a predetermined frequency, so that the respective characteristics of antennas using different frequency bands can be simultaneously improved. In this case, the different magnetic field shielding sheets may be arranged in a laminated structure, and one of the magnetic field shielding sheets may be sandwiched and arranged inside another magnetic field shielding sheet, and the specific arrangement relationship is not limited in the present invention.

Meanwhile, the magnetic field shielding sheet may be used for the purpose of shielding magnetic fields at a specific frequency, and even the same magnetic field shielding sheet may be used for the purpose of absorbing electromagnetic waves in other specific frequency bands, and when used in combination with an antenna module, the magnetic field shielding sheet can be used to achieve two purposes of shielding of magnetic fields and absorption of electromagnetic waves at the same time.

For example, when the magnetic field shielding sheet is used in combination with an antenna module in which an antenna for receiving wireless power and an antenna for near field communication (NFC) are combined with each other, the magnetic field shielding sheet functions as an inductor and acts as an absorber to absorb radio waves and as a magnetic shield to block the influence on a terminal body. That is, by increasing the quality factor (Q) of a resonance circuit, the characteristics of the antenna for receiving wireless power may be improved, and the magnetic flux may be focused toward the antenna.

First, the magnetic field shielding sheet according to an embodiment of the present invention is a magnetic field shielding sheet including at least one thin film magnetic sheet, and may be implemented as a wireless power reception module in combination with, for example, an antenna for receiving wireless power.

In this case, the magnetic field shielding sheet combined with the wireless power reception antenna may be used by punching, into a shape corresponding to the shape of the antenna, the magnetic field shielding sheet 100 supplied in the form of a strip from the winding body 119 in the form of a roll.

Figure 8:
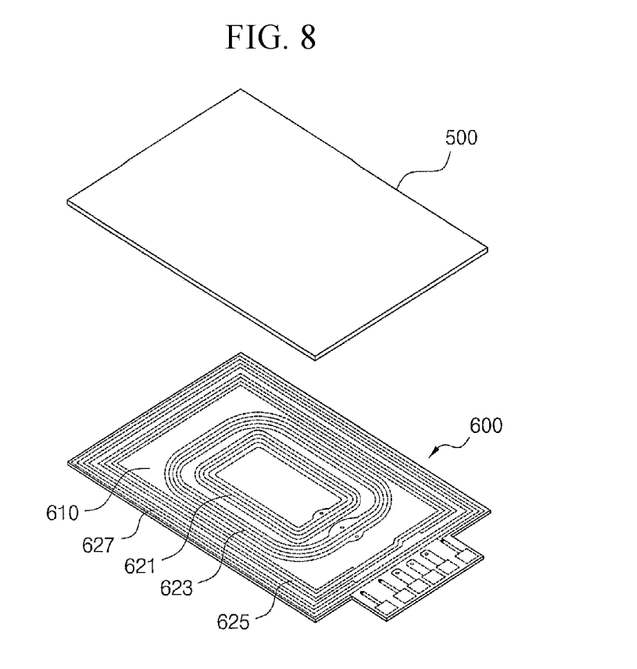
FIG. 8 is a schematic perspective view illustrating an antenna module having a magnetic field shielding sheet according to an embodiment of the present invention.

Referring to FIG. 8, a magnetic field shielding sheet 500 combined with a wireless power reception antenna is disposed on one surface of an antenna module 600 including a wireless power reception antenna 621 patterned and formed in a coil shape on a thin film circuit board 610 of a flexible printed circuit board (FPCB), to thereby improve the characteristics of the antenna for receiving wireless power and focus the magnetic flux toward the antenna.

In this case, the magnetic field shielding sheet 500 may be attached to the antenna module 600 through an adhesive member or attached to the antenna module 600 through another adhesive member (not shown), which may be provided on one surface of the sheet.

In addition, the antenna module 600 included in an embodiment of the present invention may further include at least one of an antenna for near field communication (NFC) and an antenna for magnetic security transmission (MST). The antenna 623 for magnetic security transmission is arranged outside the antenna 621 for wireless power reception and the antenna 625 for near field communication is arranged outside the antenna 623 for magnetic security transmission, to thereby be able to form the antenna module 600.

Moreover, the wireless power reception antenna 621 provided in the antenna module 600 included in an embodiment of the present invention may include any one or more of a magnetic resonance wireless power reception antenna with a frequency band including a frequency of 678 MHz as an operating frequency and a magnetic induction wireless power reception antenna with a frequency band including 100 kHz as an operating frequency.

That is, the antenna module 600 may include a magnetic induction wireless power transmission antenna 621 that is located at the innermost side and includes a frequency band having a frequency of 100 kHz as an operating frequency, and a magnetic resonance wireless power reception antenna 627 that is located at the outermost side and includes a frequency band having a frequency of 678 MHz as an operating frequency.

In addition, the magnetic field shielding sheet 500 according to an embodiment of the present invention may be implemented as a near field communication module in combination with the near field communication antenna 625. The magnetic field shielding sheet 500 is arranged on the antenna module 600 including the near field communication antenna 625 formed on the circuit board 610, thereby improving the characteristics for the near field communication antenna and focusing the magnetic flux toward the near field communication antenna.

Meanwhile, although the wireless power reception module or the near field communication module according to the present invention is illustrated as a reception module for receiving a wireless signal from a transmission module to an electronic device, the wireless power reception module or the near field communication module may be a transmission module for transmitting a wireless signal from the wireless power transmission module.

In addition, each of the antennas 621 to 627 provided in the antenna module 600 included in the wireless power transmission module or the near field communication module may be an antenna coil wound so that the coil has a constant inner diameter, or an antenna in which an antenna pattern is printed on the substrate. A specific shape, structure, size, material, etc. of the antenna are not particularly limited in the present invention.

Further, the near field communication module and/or the wireless charging module according to the embodiment of the present invention described above is a module for receiving near field communication for receiving transmitted data or a module for receiving wireless power for receiving transmitted wireless power/data. The near field communication module and/or the wireless charging module may be provided in a mobile device, through which wireless power transmission efficiency, data reception efficiency, and charging distance or data reception distance can be improved.

As described above, in the present invention, all of the flake treatment and the lamination treatment for the magnetic sheet laminate, including in-line heat treatment for the thin film magnetic sheet, can be processed by a roll-to-roll process. It is possible to provide a roll-type magnetic field shielding sheet required by antenna module providers and so on.

While the present invention has been particularly shown and described with reference to exemplary embodiments thereof, by way of illustration and example only, it is clearly understood that the present invention is not to be construed as limiting the present invention, and various changes and modifications may be made by those skilled in the art within the protective scope of the invention without departing off the spirit of the present invention.

INDUSTRIAL APPLICABILITY

The present invention can be applied to the manufacture of a magnetic field shielding sheet in which all processes including a heat treatment process of a thin film magnetic sheet are performed in a roll-to-roll manner, thereby improving the efficiency of the overall production process.

What is claimed is:

1. A magnetic field shielding sheet comprising:
at least two thin film magnetic sheets, wherein each of the at least two thin film magnetic sheets is divided into a plurality of magnetic substance fragments;
an insulating layer formed on one side or both of the each of the at least two thin film magnetic sheets;
an adhesive layer formed between the insulating layers of the at least two thin film magnetic sheets to laminate and bond the at least two thin film magnetic sheets; and
a sealing portion covering both sides of the at least two thin film magnetic sheets, the insulating layer and the adhesive layer to prevent leakage into the magnetic field shielding sheet.

2. The magnetic field shielding sheet according to claim 1, wherein the insulating layer penetrates spaces between the plurality of magnetic substance fragments.

3. The magnetic field shielding sheet according to claim 1, wherein the at least two thin film magnetic field shielding sheets are in a strip shape.

4. The magnetic field shielding sheet according to claim 1, wherein the each of the at least two thin film magnetic sheets has a thickness of 15 µm to 35 µm.

5. The magnetic field shielding sheet according to claim 1, wherein the at least two thin film magnetic sheets are formed of a thin film magnetic substance including an amorphous alloy and a nanograin alloy.

6. The magnetic field shielding sheet according to claim 1, wherein the adhesive layer is made of an acrylic adhesive and has a thickness of 5 µm or less.

7. The magnetic field shielding sheet according to claim 1, wherein the insulating layer has a thickness of 5 µm or less.

8. The magnetic field shielding sheet of claim 7, wherein the insulating layer includes an insulating layer formed of a composition containing a natural polymer compound and a synthetic polymer compound.

9. The magnetic field shielding sheet according to claim 1, further comprising: a protective member and an adhesive member respectively attached to an upper surface and a lower surface of the magnetic field shielding sheet, wherein the adhesive member comprises: an adhesive layer attached to the lower surface; and a release film for protecting the adhesive layer until the magnetic field shielding sheet is attached to an adherend.

10. The magnetic field shielding sheet according to claim 1, wherein the magnetic field shielding sheet is combined with an antenna module for wireless power transmission.

11. An antenna module for wireless power reception comprising:
an antenna configured to receive wireless power; and
a magnetic field shielding sheet disposed on one side of the antenna to improve antenna characteristics for wireless power reception and configured to focus magnetic flux toward the antenna,
wherein the magnetic field shielding sheet comprises:
at least two thin film magnetic sheets, wherein each of the at least two thin film magnetic sheet is divided into a plurality of magnetic substance fragments;
an insulating layer formed on one side or both of the each of the at least two thin film magnetic sheets;
an adhesive layer formed between the insulating layers of the at least two thin film magnetic sheets to laminate and bond the at least two thin film magnetic sheets; and
a sealing portion covering both sides of the at least two thin film magnetic sheet, the insulating layer and the adhesive layer to prevent leakage into the magnetic field shielding sheet.

12. A method of manufacturing a magnetic field shielding sheet, the method comprising:
manufacturing a thin film magnetic sheet wound in a roll form;
performing in-line heat treatment for the thin film magnetic sheet by using a heat treatment furnace to form a heat-treated thin film magnetic sheet in a roll form;
forming an insulating layer on one side or both sides of the heat-treated thin film magnetic sheet by using an insulator coating device to form an insulated thin film magnetic sheet in a roll form;
laminating the insulated thin film magnetic sheet to form a magnetic sheet laminate formed of multiple layers of the insulated thin film magnetic sheet;
sealing both sides of the magnetic sheet laminate; and
flake-treating the magnetic sheet laminate to divide the heat-treated thin film magnetic sheet into a plurality of magnetic substance fragments to form a flake-treated magnetic sheet laminate; wherein the laminating comprises: forming an adhesive layer between two neighboring layers of the insulated thin film magnetic sheet to bond the two neighboring layers of the insulated thin film magnetic sheet.

13. The method of manufacturing a magnetic field shielding sheet according to claim 12, further comprising: laminating a temporary protection member on one side of the magnetic sheet laminate or the flake-treated magnetic sheet laminate.

14. The method of manufacturing a magnetic field shielding sheet according to claim 12, further comprising: laminating a temporary protection member and an adhesive layer on both sides of the magnetic sheet laminate or the flake-treated magnetic sheet laminate.

15. The method of manufacturing a magnetic field shielding sheet according to claim 12, further comprising: flattening the flake-treated magnetic sheet laminate and reducing a thickness of the flake-treated magnetic sheet laminate.

* * * * *